(12) United States Patent
Jung et al.

(10) Patent No.: US 7,745,096 B2
(45) Date of Patent: Jun. 29, 2010

(54) PHOTOSENSITIVE POLYIMIDE COMPOSITION, POLYIMIDE FILM AND SEMICONDUCTOR DEVICE USING THE SAME

(75) Inventors: Myung Sup Jung, Seongnam-si (KR); Sang Mock Lee, Yongin-si (KR); Jingyu Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 11/861,948

(22) Filed: Sep. 26, 2007

(65) Prior Publication Data

US 2008/0187867 A1     Aug. 7, 2008

(30) Foreign Application Priority Data

Feb. 1, 2007     (KR) ...................... 10-2007-0010485

(51) Int. Cl.
*G03F 7/004* (2006.01)
*G03F 7/30* (2006.01)

(52) U.S. Cl. .................... 430/270.1; 430/326; 430/330; 430/906

(58) Field of Classification Search .............. 430/270.1, 430/326, 330, 906
See application file for complete search history.

(56) References Cited

U.S. PATENT DOCUMENTS

| | | | |
|---|---|---|---|
| 3,957,512 A | 5/1976 | Kleeberg et al. | |
| 4,243,743 A | 1/1981 | Hiramoto et al. | |
| 4,812,531 A * | 3/1989 | Treybig | 525/419 |
| 4,927,913 A * | 5/1990 | Treybig | 528/480 |
| 6,096,850 A * | 8/2000 | Chiang et al. | 528/38 |
| 7,129,011 B2 * | 10/2006 | Rushkin et al. | 430/18 |
| 7,157,204 B2 * | 1/2007 | Jung et al. | 430/270.1 |
| 2003/0194631 A1* | 10/2003 | Suwa et al. | 430/151 |
| 2004/0253537 A1* | 12/2004 | Rushkin et al. | 430/270.1 |
| 2004/0265731 A1* | 12/2004 | Okada et al. | 430/270.1 |

FOREIGN PATENT DOCUMENTS

| | | |
|---|---|---|
| EP | 0957124 | 11/1999 |
| JP | 62135824 | 6/1987 |
| JP | 5213315 | 8/1993 |
| JP | 6037550 | 2/1994 |
| JP | 0733874 | 2/1995 |
| JP | 10-316751 | 12/1998 |
| JP | 2004-212678 | 7/2004 |
| KR | 1020020079483 A | 10/2002 |
| KR | 1020030008216 A | 1/2003 |
| KR | 1020040040662 | 5/2004 |
| KR | 1020050058062 A | 6/2005 |

* cited by examiner

*Primary Examiner*—John S Chu
(74) *Attorney, Agent, or Firm*—Cantor Colburn LLP (57) ABSTRACT

A photosensitive polyimide composition, a polyimide film, and a semiconductor device using the same are disclosed. The photosensitive polyimide composition can be cured by heating. A polyhydroxyimide is used as a base resin and can be mixed with a photoacid generator and a cross-linking agent having two or more vinylether groups. A film of the photosensitive polyimide composition can be developed by treatment with an alkaline aqueous solution. Embodiments of the invention enable improvement in production yield and reliability in a highly-integrated memory semiconductor packaging processes.

18 Claims, 6 Drawing Sheets

PHOTOSENSITIVE POLYIMIDE COMPOSITION, POLYIMIDE FILM AND SEMICONDUCTOR DEVICE USING THE SAME

This application claims priority to Korean Patent Application No. 10-2007-0010485, filed on Feb. 1, 2007, and all benefits accruing therefrom under 35 U.S.C. §119, the contents of which in its entirety are herein incorporated herein by reference.

BACKGROUND OF THE INVENTION

1. Field of the Invention

Disclosed herein is a photosensitive polyimide composition, a polyimide film, and a semiconductor device using the same. Disclosed herein too is a photosensitive polyimide composition, a polyimide film, and a semiconductor device using the same, in which a polyhydroxyimide is used as a base resin. The polyhydroxyimide is mixed with a photoacid generator and a cross-linking-agent. The film of the photosensitive polyimide composition can be cured by heating.

2. Description of the Related Art

A photosensitive polyimide is polyimide that is sensitive to light or similar radiation. When the photosensitive polyimide is applied to a stress buffer layer or an interlayer insulating film during a semiconductor fabrication process, photoresist processes can be performed to form a pattern of the polyimide.

Also, resolution and miniaturization are being emphasized in semiconductor chip packaging by the recent trend towards thinner and light weight packaging. In this respect, recent developments have focused on chip scale packaging (CSP) technology. At present, the CSP technology is being developed and applied to the semiconductor chip package at various levels. In particular, recent developments have focused on wafer-level CSP technology, which finishes a chip package on a wafer.

Figure 1:
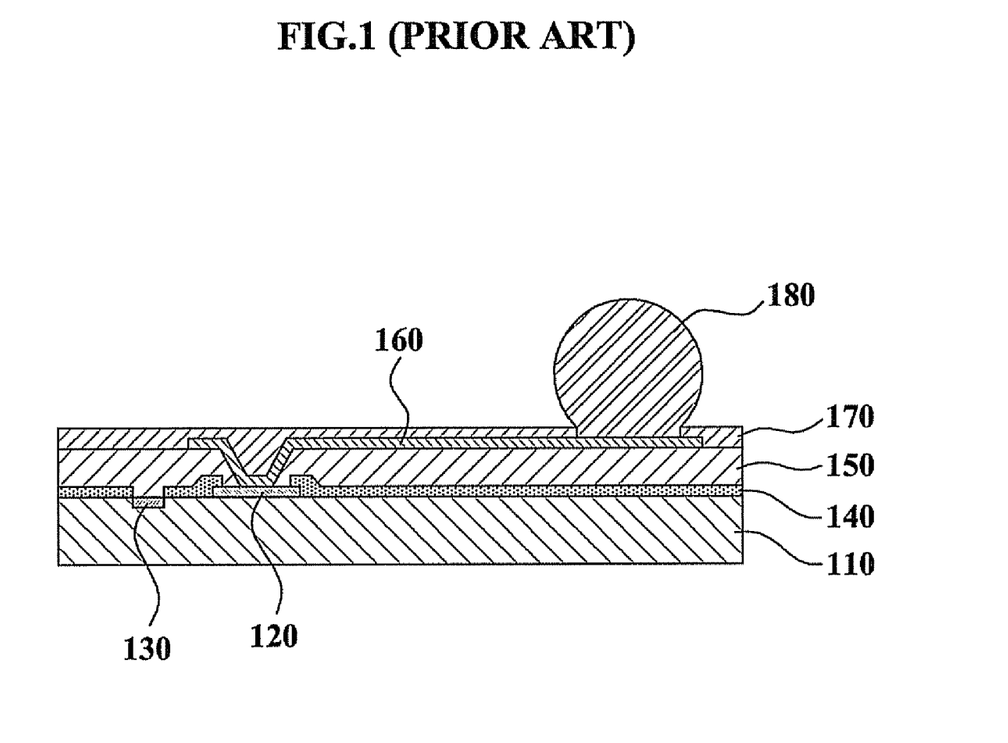
FIG. 1 illustrates a prior art structure of wafer-level chip-scale packaging (CSP) according to the prior art.

A wafer-level CSP of the prior art is shown in FIG. 1. As shown in FIG. 1, in a wafer-level CSP, a semiconductor chip 110, which comprises an integrated circuit, is connected to a solder ball 180 through an input and output pad 120 and a redistribution layer 160. This structure is made in a batch process at the wafer level. In addition to input and output pad 120, a fuse box 130 is formed on the semiconductor chip 110. Inert layer 140 is formed on portions of semiconductor chip 110 other than the fuse box 130 and input and output pad 120. Formed on inert layer 140 is a first polymer layer 150. First polymer layer 150 is partially removed and then redistribution layer 160 formed along the top surface of the first polymer layer 150, such that redistribution layer 160 is disposed on the exposed portion of input and output pad 120. The redistribution layer 160 is then covered with a second polymer layer 170. The second polymer layer 170 is partially removed and solder ball 180 formed on the exposed portion of redistribution layer 160. Also, the redistribution layer 160 can be varied to accommodate the wafer-level CSP configuration. For example, an under bump metallurgy (UBM) can be formed in a region where the solder ball 180 is formed.

Figure 2:
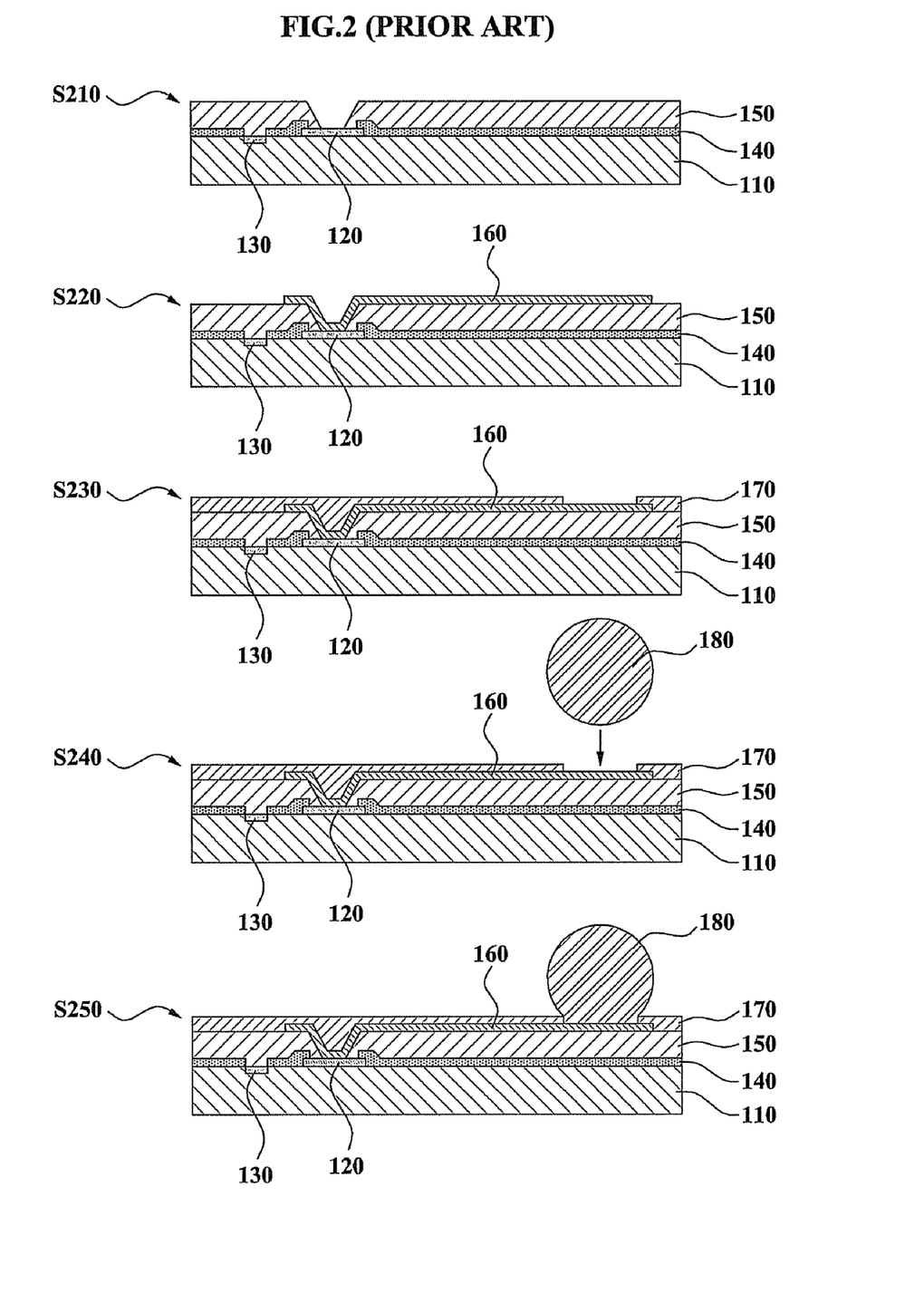
FIG. 2 illustrates a prior art process to provide the wafer-level CSP of FIG. 1.

FIG. 2 shows a prior art fabrication process of the prior art wafer-level CSP illustrated in FIG. 1. Referring to FIG. 2, after the first polymer layer 150 is deposited and patterned in process S210, metal is sputtered on the first polymer layer 150 in process S220, and then etched to form a trace and a pad, thereby forming the redistribution layer 160. Subsequently, the second polymer layer 170, which covers the redistribution layer 160 and the first polymer layer 150, is deposited and patterned through in process S230, and then a solder ball 180 is arranged on the exposed redistribution layer 160 in process S240. Subsequently, in process S250, soldering is completed using reflow soldering.

As described above, in wafer-level CSP technology, peripheral input and output pads are redistributed as an array of solder terminals using thin film processes. This redistribution can mitigate the problem of resolving integrated circuit peripheral terminals.

Photosensitive polyimides can be classified into a negative type and a positive type. Examples of negative photosensitive polyimides are disclosed in U.S. Pat. No. 3,957,512 to Kleeberg et al. (hereinafter "'512") and U.S. Pat. No. 4,243,743 to Hiromoto et al. (hereinafter "'743"). The '512 patent discloses a polyamic acid where a photosensitive functional group is coupled with a polyimide precursor by ester bonding. The '743 patent discloses a photosensitive polyimide where a photosensitive group and a compound having amino component are coupled with a polyamic acid by ion bonding. The '512 and '743 patents disclose that when a resist composition solution including polyimide is coated on a wafer, and then exposed to light, photopolymerization occurs in the portion where the resist composition solution was exposed, so that cross-linking occurs between precursor molecules, causing the resist composition solution to become insoluble. The resist composition is developed using an organic solvent to remove the unexposed area, and then the imidization reaction is completed by heating to obtain a polyimide layer with the desired pattern.

However, while not being limited by theory, such negative polyimide photoresists have problems in that their resolution is poorer than that of positive polyimide photoresists, and the resists, or related resist formation or stripping processes, are likely to generate a defect. Also, since an organic solvent, such as N-methyl-2-pyrrolidone (NMP) or dimethylacetamide (DMAc), is used as a developing solution for negative polyimide photoresists, in addition to high cost, their use is undesirable because of their environmental impact. For at least these issues, in summary, a positive polyimide photoresists that can be developed in an alkaline aqueous solution would be preferred for semiconductor processes.

Examples of positive polyimide photoresists are disclosed in Japanese Patent Publication Nos. 52-13315, 62-135824, 60-37550, and 7-33874, wherein Japanese Patent Publication Nos. 52-13315 and 62-135824 disclose a method for manufacturing a pattern using the difference in dissolution speed between an exposed area and an unexposed area, by mixing a polyimide precursor, specifically a polyamic acid, with a dissolution inhibitor, specifically a naphthoquinonediazide compound. Japanese Patent Publication No. 60-37550 discloses a photosensitive polyimide where a photosensitive group, specifically o-nitrobenzelester group, is coupled with a polyimide precursor by ester bonding. Japanese Patent Publication No. 7-33874 discloses a chemically amplified composition manufactured by mixing a resin with a photoacid generator, the resin being obtained by substituting a functional group that can be dissociated by an acid for a carboxylic group of polyamic acid.

In prior art positive polyimide photoresist technologies, the pattern is formed by a photolithography process wherein a precursor, comprised of polyimide, is converted into polyimide through a curing process at a temperature of 300° C. or greater. However, without being limited by theory, it is thought that such processes, when employed in wafer-level CSP, cause defects in integrated semiconductor devices, in part due to the high temperature of curing processes. For this reason, a positive polyimide photoresist that offers a lower temperature curing process is needed.

BRIEF SUMMARY OF THE INVENTION

Embodiments of the present invention provide a photosensitive polyimide composition, a polyimide film, and a semiconductor device using the same. In an embodiment of the invention, a polyhydroxyimide, used as a base resin, is mixed with a photoacid generator and a cross-linking agent. In another embodiment of the invention, the cross-lining agent can have two or more vinylether groups. An alternative embodiment of the invention provides a photosensitive polyimide composition that can be cured by heating. In another alternative embodiment of the invention, the photosensitive polyimide composition can be cured by heating at about 150° C. or less.

Disclosed in an embodiment of the present invention is a photosensitive polyimide composition comprising polyhydroxyimide, a cross-linking agent, and a photoacid generator.

The polyhydroxyimide is expressed by the following chemical formula 1:

[Chemical formula 1]

wherein X is a quadrivalent aromatic group or aliphatic organic group, Y is a quadrivalent aromatic group or aliphatic organic group, Z is hydrogen or a cross-linkable monovalent organic group, and n is an integer between 1 and 1000.

X in chemical formula 1 can be selected from a group comprising:

-continued

Y in chemical formula 1 can be selected from a group comprising:

Z in chemical formula 1 can be selected from a group comprising hydrogen,

The cross-linking agent can be a compound having two or more vinylether groups. Examples of the cross-linking agent include, 2,2'-bis(4-(2-(vinyloxy)ethoxy)phenyl)propane (BPA-DEVE), 1,1,1-tris(4-2-(vinyloxy)ethoxy)phenyl) ethane, 1,3,5-tris(2-(vinyloxy)ethoxy)benzene, poly(ethylene glycol)divinyl ether, 4,4'-bis-but-3-enyloxy-biphenyl, and 1,5-bis-but-3-enyloxy-naphthalene, and the like, or a combination of at least one of the foregoing compounds.

The photoacid generator comprises a compound selected from a group consisting of a halide based compound, sulfonic compound, an ammonium salt compound, a diazonium salt compound, an iodine salt compound, a sulfonium salt compound, a phosphonium salt compound, an onium salt polymeric compound, a selenium salt compound, and an azonium salt compound, and the like, or a combination of at least one of the foregoing compounds.

In an alternative embodiment of the present invention, disclosed is a polyimide film in which the photosensitive polyimide composition can be coated on a wafer, exposed, developed in an alkaline aqueous solution, and cured by heat.

The alkaline aqueous solution can be a quaternary ammonium hydroxide aqueous solution or amine based aqueous solution.

The quaternary ammonium hydroxide aqueous solution is comprised of tetramethylammoniumhydroxide or tetraethylammoniumhydroxide and the like, and the amine-based aqueous solution can be comprised of ethanol and an aqueous amine solution, specifically propylamine aqueous solution, and the like.

In an alternative embodiment of the invention, the photosensitive polyimide composition is employed in a method for redistribution in wafer-level CSP.

In another embodiment of the invention, disclosed is a semiconductor device comprising a polyimide film.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the embodiments of the present invention will become apparent and more readily appreciated from the following detailed description, taken in conjunction with the accompanying drawings of which:

The detailed description further explains the embodiments of the invention, together with advantages and features, by way of example with reference to the drawings.

DETAILED DESCRIPTION OF THE INVENTION

Embodiments of the present invention will now be described in greater detail with reference to the accompanying drawings.

It will be understood that when an element is referred to as being "on" another element, it can be directly on the other element or intervening elements can be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to exemplary embodiments of the present invention, examples of which are illustrated in the accompanying drawings. In the drawings, reference numerals in the drawings denote like elements and the thicknesses of layers and regions are exaggerated for clarity. The exemplary embodiments are described below in order to explain the embodiments of the present invention by referring to the figures.

In an embodiment of the invention, a photosensitive polyimide composition comprises about 5 weight percent (wt %) to about 60 weight percent polyhydroxyimide, specifically about 10 weight percent to about 50 weight percent, more specifically about 20 weight percent to about 40 weight percent. When the content of the polyhydroxyimide exceeds about 60 weight percent, viscosity of the composition is too high to perform filtering for full dissolution of polyhydroxyimide and removal of impurities. When the content of the polyhydroxyimide is less than about 5 weight percent, the concentration of the composition is too low to form a thick film through spin coating, thereby deteriorating smoothness.

Furthermore, in a photosensitive polyimide composition according to an embodiment of the present invention, the amount of cross-linking agent is determined by the amount of polyhydroxyimide. The cross-linking agent is contained in an amount of about 5 weight percent to about 50 weight percent of the amount of polyhydroxyimide, specifically about 10 weight percent to about 40 weight percent, more specifically about 10 weight percent to about 20 weight percent. When the cross-linking agent is contained in amount that exceeds about 50 weight percent of the polyhydroxyimide, mechanical properties of a final curing film become weak. When the content of the cross-linking agent is less than about 5 weight percent of the polyhydroxyimide, sufficient cross-linking reaction does not occur in an unexposed area. For this reason, a problem occurs in that the cross-linking agent is dissolved in a developing solution.

Furthermore, in a photosensitive polyimide composition as disclosed in in embodiments of the present invention, the content of photoacid generator is determined by the content of polyhydroxyimide. The content of the photoacid generator can be in the range of about 1 weight percent to about 30 weight percent of the content of polyhydroxyimide used, specifically about 5 weight percent to about 25 weight percent, more specifically about 10 weight percent to about 20 weight percent. When the photoacid generator is contained in an amount that exceeds about 30 weight percent polyhydroxyimide, mechanical properties of the final cured film can be weak. When the photoacid generator is contained in an amount less than about 1 weight percent polyhydroxyimide, acid dissociation reaction does not sufficiently occur in exposed areas. If the photoacid generator is contained in an amount less than about 1% of the amount of polyhydroxyimide, a problem occurs in that it is difficult to form a pattern.

A thermal cross-linking reaction mechanism, driven by heat, and a disassociative decross-linking reaction mechanism, driven by an acid, of an exemplary photosensitive polyimide composition, according an embodiment of the present invention, will be described with reference to the following reaction equation 1.

tive polyimide composition. The cross-linking reaction is generated by heat, and the decross-linking reaction is generated by an acid.

Figure 3:
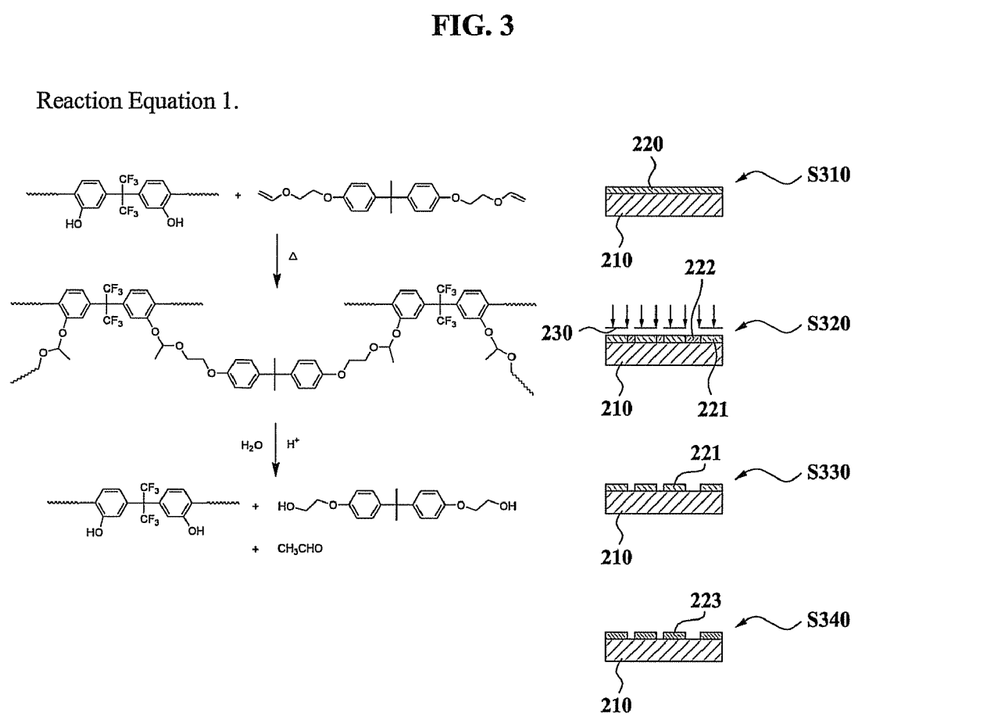
FIG. 3 illustrates a reaction scheme and process to perform redistribution using a polyhydroxyimide (PHI) composition according to an embodiment of the present invention.

As shown in FIG. 3, in spin coating and pre-baking process operation S310, a photosensitive polyimide composition 220 is spin coated on a wafer 210 and pre-baked. The heating removes the organic solvent of the composition by volatilization and at the same time the vinylether group of BPA-DEVE and the hydroxyl group of polyhydroxyimide are cross-linked by the heating to form cross-linked bonding in an acetal structure, as shown in the reaction equation 1 of FIG. 3. Afterwards, in exposure and post-exposure-baking (PEB) process operation S320, exposure to ultraviolet (UV) light is performed through a photo mask 230. The exposure to UV causes the photoacid generator to generate acid in an exposed area 222. Thus in exposed area 222, the cross-linked bonding of the acetal structure is dissociated by acid during the post-exposure-baking process, the acid being generated by the photoacid generator, as shown in the reaction equation of FIG. 3. The products of the dissociation reaction can include polyhydroxyimide, alcohol and acetaldehyde. Next, in developing process operation S330, wherein an alkaline aqueous solution is used as a developing solution, unexposed polyhydroxyimide is not dissolved in the developing solution because it is cross-linked with polyhydroxyimide by BPA-DEVE in unexposed area 221. However, since the cross-

[Reaction Equation 1]

As shown above in reaction equation 1, a photosensitive polyimide composition, according to an exemplary embodiment of the present invention, comprising polyhydroxyimide, and an exemplary cross-linking agent (BPA-DEVE in the case of the reaction equation 1), are crosslinked with each other by heat. Subsequently they can be decross-linked (dissociated) to polyhydroxyimide, alcohol and acetaldehyde by an acid. The acid can be generated by a photoacid generator.

Referring to FIG. 3, a pattern can be formed by using the cross-linking reaction of the photosensitive polyimide composition and the decross-linking reaction of the photosensilinked structure is dissociated in exposed area 222, exposed polyhydroxyimide can be dissolved in the alkaline aqueous solution, thereby forming a pattern. Finally, curing process operation S340 is performed to cure the pattern 223.

Hereinafter, additional details of embodiments of the present invention will be described with reference to the following examples. Although embodiments of the present invention will be described with reference to the following examples, the scope of the present invention is not limited to the examples.

EXAMPLES

Synthetic Example 1

In a 500 milliliter round-bottom flask, 18.31 grams of 2,2-bis(3-amino-4-hydroxyphenyl)hexafluoropropane was dissolved in 80 milliliters of NMP. While keeping the flask at 0° C. to 5° C., 15.51 grams of 4,4'-oxydiphthalic anhydride (ODPA) was slowly added to the flask while stirring, and the mixture stirred for 16 hours. Subsequently, 80 milliliters of NMP and 50 milliliters of toluene were added to the flask, and then a Dean-Stark distillation apparatus was installed in the flask. The obtained poly(amic acid) was thermally imidized by treatment at 160° C. for 3 hours. Meanwhile, the water generated from the ring-closure reaction was separated as a toluene azeotrope. After the reaction was completed, the solution was cooled and solidified by addition of a 1:4 mixture of methanol:water. The solidified powder was filtered and dried in a vacuum oven for 48 hours at 40° C. to obtain a white resin powder, 32 grams. The molecular weight of polyhydroxyimide, as analyzed by gel permeation chromatography (GPC), to determine the number average molecular weight was 11,253 daltons and the weight average molecular weight was 54,300 daltons.

A reaction scheme corresponding to the synthesis of polyhydroxyimide performed in the Synthetic Example 1 is shown in the following reaction equation 2:

Synthetic Example 2

In to a 500 milliliter round bottom flask, 2,2-bis(3-amino-4-hydroxyphenyl)hexafluoropropane, 25.64 grams, and NMP, 150 milliliters, were sequentially injected, and then slowly stirred until fully dissolved. To the flask was slowly added 4,4'-oxydiphthalic anhydride (ODPA), 19.54 grams, while keeping the flask at 0° C. to 5° C. The reaction solution was stirred for 2 hours and then maleic anhydride, 1.37 grams, was added thereto. The reaction solution was additionally stirred for 16 hours at 0° C. to 5° C. Next, to the reaction solution were added NMP, 100 milliliters, and toluene, 70 milliliters, and then a Dean-Stark distillation apparatus was installed in the flask. The obtained poly(amic acid) was thermally imidized at 160° C. for 3 hours and then cooled and solidified by addition of a 1:4 mixture of methanol:water. The solidified powder was filtered and dried in a vacuum oven for 24 hours at 40° C. to obtain a white resin powder, 45 grams.

A reaction scheme corresponding to the synthesis of polyhydroxyimide disclosed in Synthetic Example 3 is shown in the following reaction equation 3.

[Reaction Equation 2]

[Reaction Equation 3]

In the above reaction equation, NMP is N-methyl-2-pyrrolidone.

The molecular weight of the polyhydroxyimide, as provided by Synthetic Example 2, was analyzed by GPC, to determine the number average molecular weight was 3,240 daltons and the weight average molecular weight was 5,830 daltons.

Example 1

Five solutions (numbered 1-1 to 1-5) of polyhydroxyimide, prepared according to the method of Synthetic Example 1, were prepared by adding BPA-DEVE in the amounts of 0 weight percent, 5 weight percent, 10 weight percent, 12 weight percent, or 15 weight percent of polyhydroxyimide, respectively. Each solution was spin-coated on a wafer and then baked at 130° C. for 3 minutes. The dissolution rate of the resulting coating was measured in an aqueous solution of tetramethylammoniumhydroxide (TMAH), 2.38 weight percent. The results are shown in Table 1 below.

TABLE 1

| | Solution | | | | |
|---|---|---|---|---|---|
| | 1-1 | 1-2 | 1-3 | 1-4 | 1-5 |
| BPA-DEVE content (weight percent) | 0 | 5 | 10 | 12 | 15 |
| Dissolution speed (nanometers per second) | 712 | 325 | 23 | 14 | 4 |

As shown in Table 1 above, when no BPA-DEVE was added (0 weight percent, solution 1-1), the dissolution rate of 712 nanometers per second was observed. Unexpectedly, it has been discovered that when 15 weight percent of BPA-DEVE was added (solution 1-5), the dissolution rate was reduced to 4 nanometers per second by the cross-linking reaction between the hydroxyl group of the polyhydroxyimide and the vinylether group of BPA-DEVE. Unexpectedly, it has also been discovered that, when BPA-DEVE was contained in an amount of 10 weight percent of amount of polyhydroxyimide (solution 1-3), the dissolution rate was reduced to 23 nanometers per second. In other words, it is noted from the results reported in Table 1, that the cross-linking reaction between the hydroxyl group of polyhydroxyimide and the vinylether group of BPA-DEVE was successful.

Figure 4:
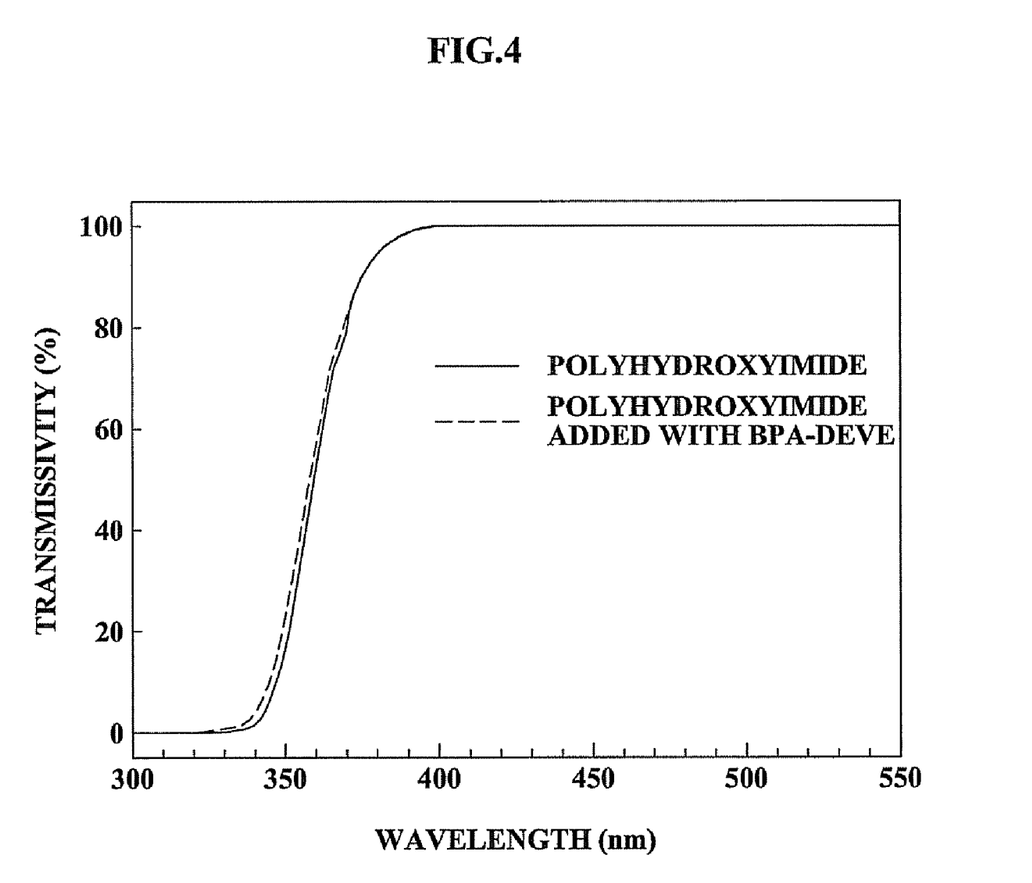
FIG. 4 illustrates ultraviolet (UV) transmissivity of polyhydroxyimide (PHI), and the UV transmissivity of polyhydroxyimide mixed with 2,2'-bis(4-(2-(vinyloxy)ethoxy)phenyl)propane (BPA-DEVE), when BPA-DEVE is contained in an amount of 15 weight percent of the amount of polyhydroxyimide, in an embodiment of the invention.

FIG. 4 shows a UV-visible transmission spectrum of 5 micrometer thick film of the polyhydroxyimide. It is noted from FIG. 4 that the polyhydroxyimide has unexpectedly excellent transmittance of about 70% at i-line (365 nanometers), a light source that can be used in a photolithography processes. It is also noted from FIG. 4 that unexpectedly the polyhydroxyimide still maintains excellent UV transmittance, even in the case where 15 weight percent of BPA-DEVE was used.

Example 2

Polyhydroxyimide, 3 grams, and BPA-DEVE, 0.45 grams, as provided by Synthetic Example 1, were dissolved in 7 grams of NMP. Next, diphenyliodonium 5-hydroxynaphthalene-1-sulfonate (DINS), which serves as a photoacid generator, was added in the amounts of 5 weight percent, 12.5 weight percent, 14.8 weight percent, 18 weight percent and 23 weight percent of the polyhydroxyimide, respectively, to provide five compositions. Each composition was spin-coated on a wafer and then baked at 130° C. for 3 minutes. Subsequently, each composition underwent UV exposure and then a post-exposure bake (PEB) process at 130° C. for 90 seconds. The dissolution speed was then measured in a 2.38 weight percent TMAH aqueous solution. The results of the dissolution speed measurements are shown in FIG. 5.

Figure 5:
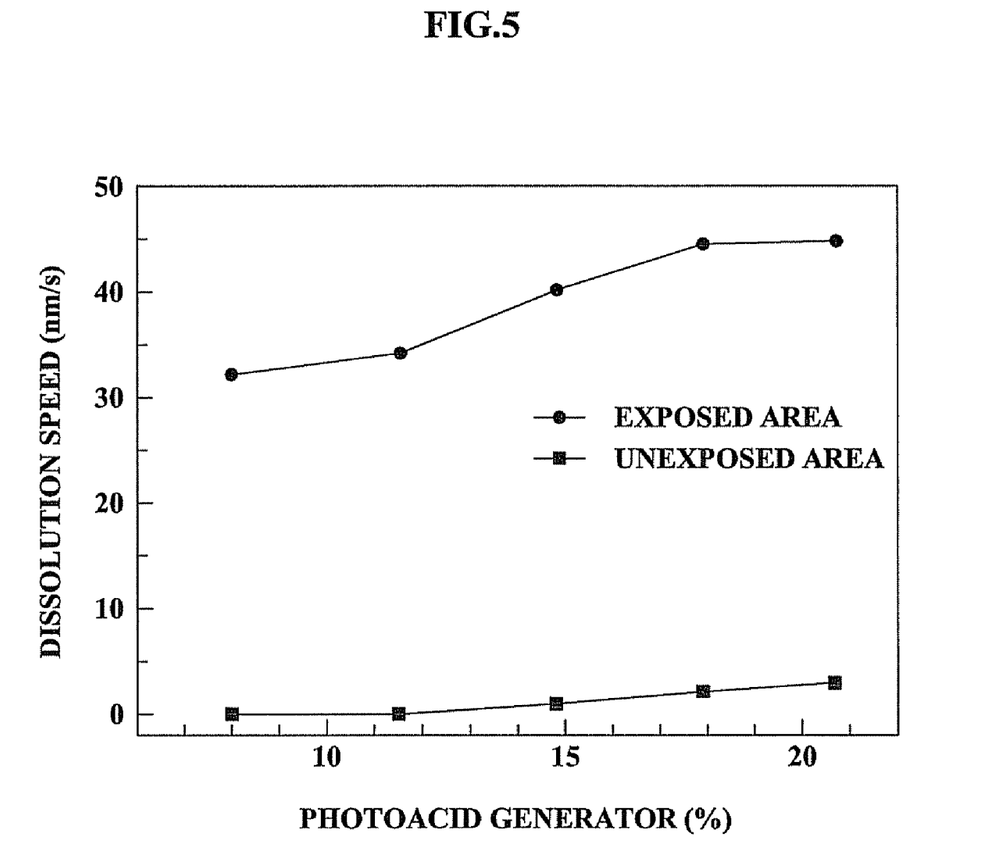
FIG. 5 illustrates variation in dissolution speed of an exposed area and an unexposed area when utilizing a photoacid generator (PAG) in a photosensitive polyimide composition according to an embodiment of the present invention.

FIG. 5 illustrates variation in the dissolution rate of the exposed area and the unexposed area according to the content of the photoacid generator. Unexpectedly, it is noted from the results illustrated in FIG. 5 that the acetal cross-linked structure, generated by reaction of polyhydroxyimide and BPA-DEVE, is dissociated effectively by acid, the acid generated by UV irradiation of the photoacid generator.

Example 3

A) Manufacture of Photosensitive Polyimide Composition

The polyhydroxyimide synthesized in the Synthetic Example 1, 3 grams, was dissolved in 7 grams of NMP. BPA-DEVE, 0.45 grams, and of DINS, 0.45 grams (photoacid generator), were dissolved in the polyhydroxyimide solution. The resulting solution was then filtered through a 1 micrometer poly(tetrafluoroethylene) filter to provide a photosensitive polyimide composition.

B) Manufacture of Photosensitive Polyimide Pattern

The photosensitive polyimide composition prepared in A) was spin-coated on a 4 inch diameter silicon wafer and then prebaked at 90° C. for 2 minutes and 130° C. for 2 minutes to obtain a film of about 5 micrometers thickness. A photomask was vacuum-pressed against the coated silicon wafer to provide an assembly, and photomask side of the assembly then irradiated with filtered UV light having a wavelength of 365 nanometers and a flux of 1000 millijoules per square centimeter from a high-pressure mercury lamp (ORIEL Instruments). The wafer was then post-exposure baked at 130° C. for 1.5 minutes, and developed in a 2.38 wt % TMAH aqueous solution for 4 minutes. A clear, 3.7 micrometer thick film pattern was thus obtained after rinsing with distilled water. The resulting photosensitive polyimide pattern is shown in FIGS. 6 and 7.

Figure 6:
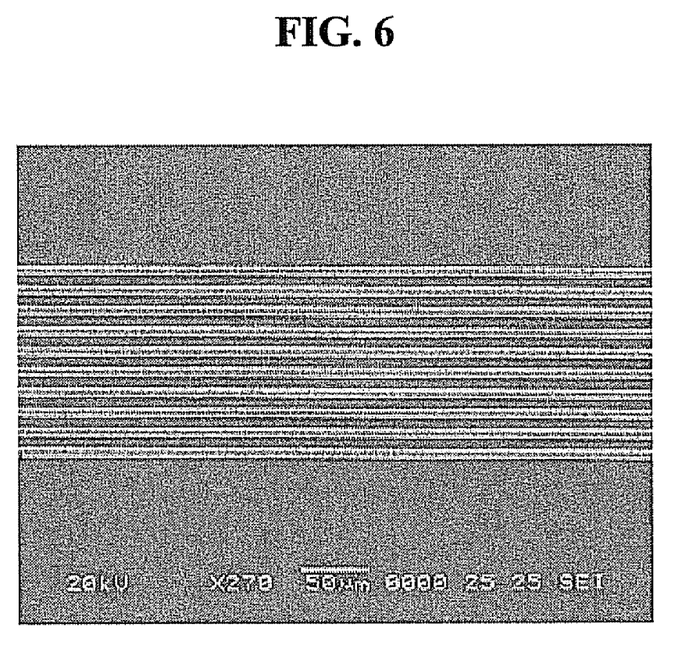
FIG. 6 is a scanning electron microscope (SEM) image illustrating 5 micrometer ($\mu$m) lines and spaces in a film with a thickness of 3.7 $\mu$m in a pattern formed using a photosensitive polyimide composition according to an embodiment of the present invention.
Figure 7:
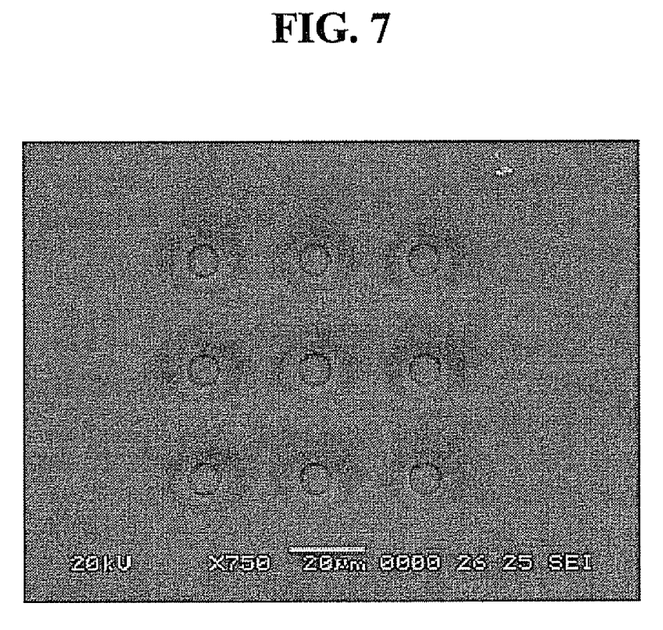
FIG. 7 is a SEM image illustrating holes of diameter 10 $\mu$m in a film with thickness of 3.7 $\mu$m in a pattern formed using a photosensitive polyimide composition according to an embodiment of the present invention.

FIG. 6 is a scanning electron microscope (SEM) image illustrating 5 μm lines and spaces in a 3.7 micrometer thick film in a pattern prepared according an exemplary embodiment of the invention. FIG. 7 is a SEM image illustrating 10 micrometer diameter holes in a 3.7 micrometer thick film in a pattern prepared according an exemplary embodiment of the invention. It is noted from FIGS. 6 and 7 that an elaborate and unexpectedly clear pattern was formed using the photosensitive polyimide composition according to an embodiment of the present invention.

As described above, the chemically amplified photosensitive polyimide composition using cross-linking and decrosslinking reactions according to embodiments of the present invention can be cured at a low temperature of 150° C. or less, because polyhydroxyimide that is already imidized during polyimide synthesis is used as a base resin.

In addition, since the photosensitive polyimide composition can be cured at a low temperature, unexpected and remarkable improvements in production yield and reliability in highly integrated memory semiconductor packaging processes are possible.

Although a few exemplary embodiments of the present invention have been shown and described, the present invention is not limited to the described exemplary embodiments. Instead, it would be appreciated by those skilled in the art that changes can be made to these exemplary embodiments without departing from the principles and spirit of the invention, the scope of which is defined by the claims and their equivalents.

Thus while the invention has been described with reference to an exemplary embodiment, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A photosensitive polyimide composition comprising polyhydroxyimide, a cross-linking agent comprising two or more vinylether groups, and a photoacid generator.

2. The photosensitive polyimide composition of claim 1, wherein the polyhydroxyimide is expressed by the following chemical formula 1:

[chemical formula 1]

where X is a quadrivalent aromatic group or an aliphatic organic group, Y is the quadrivalent aromatic group or the aliphatic organic group, Z is H or a cross-linkable monovalent organic group, and n is an integer between 1 and 1000.

3. The photosensitive polyimide composition of claim 2, wherein X in chemical formula 1 is selected from a group consisting of

-continued

4. The photosensitive polyimide composition of claim 2, wherein Y in chemical formula 1 is selected from a group consisting of 5. The photosensitive polyimide composition of claim 2, wherein Z in chemical formula 1 is selected from a group consisting of H, -continued 6. The photosensitive polyimide composition of claim 1, wherein the photoacid generator comprises a halide-based compound, a sulfonic compound, an ammonium salt compound, a diazonium salt compound, an iodine salt compound, a sulfonium salt compound, a phosphonium salt compound, an onium salt polymeric compound, a selenium salt compound, or an azonium salt compound, or a combination of at least one of the foregoing compounds.

7. A polyimide film in which the photosensitive polyimide composition of claim 1 is coated on a wafer, exposed, developed in an alkaline aqueous solution, and cured by heat.

8. The polyimide film of claim 7, wherein the alkaline aqueous solution comprises a quaternary ammonium hydroxide aqueous solution, an amine-based aqueous solution, or a combination of the foregoing solutions.

9. The polyimide film of claim 8, wherein the quaternary ammonium hydroxide aqueous solution is a tetramethylammoniumhydroxide or a tetraethylammoniumhydroxide aqueous solution, and the amine-based aqueous solution is an ethanol amine aqueous solution or a propylamine aqueous solution.

10. A semiconductor device comprising the polyimide film of claim 7.

11. The polyimide film of claim 7, wherein the film is cured at a temperature of about 150° C. or less.

12. A method of integrated circuit redistribution, the method comprising:
providing a wafer; and
forming a redistribution layer on the wafer using photolithographic process with a photosensitive polyimide composition, the photosensitive polyimide composition comprising polyhydroximide, a cross-linking agent comprising two or more vinylether groups, and a photoacid generator.

13. A method of chip scale packaging, the method comprising:
providing a wafer; and
forming a redistribution layer on the wafer using photolithographic process with a photosensitive polyimide composition, the photosensitive polyimide composition comprising polyhydroximide, a cross-linking agent comprising two or more vinylether groups, and a photoacid generator;
arranging a solder ball on the redistribution layer; and
soldering the solder ball.

14. A polyhydroxyimide described by chemical formula 3:

[Chemical Formula 3]

wherein n is 1 to 1000.

15. A photolithographic method comprising:
mixing a polyhydroxyimide, a cross-linking agent comprising two or more vinylether groups, and solvent;
adding a photoacid generator to provide a photosensitive polyimide composition;
coating a wafer with the photosensitive polyimide composition;
baking the coated wafer at a temperature of less than about 150° C.;
exposing the coated wafer to light;
treating the coated wafer at a temperature of less than about 150° C.; and
developing the coated wafer in an aqueous solution to provide a wafer with a patterned film.

16. The method of claim 15, further comprising wherein the photoacid generator comprises a halide based compound, sulfonic compound, an ammonium salt compound, a diazonium salt compound, an iodine salt compound, a sulfonium salt compound, a phosphonium salt compound, an onium salt polymeric compound, a selenium salt compound, and an azonium salt compound, or a combination of at least one of the foregoing compounds.

17. The method of claim 15, further comprising wherein the aqueous solution comprises tetramethylammoniumhydroxide.

18. A photolithographic method comprising:
mixing a polyhydroxyimide, a cross-linking agent comprising two or more vinylether groups, and solvent;
adding a photoacid generator to provide a photosensitive polyimide composition;
coating a wafer with the photosensitive polyimide composition;
pre-baking the coated wafer at a temperature of less than 100° C.;
baking the coated wafer at a temperature of less than about 150° C.;
exposing the coated wafer to light;
treating the coated wafer at a temperature of less than about 150° C.; and
developing the coated wafer in an alkaline aqueous solution to provide a wafer with a patterned film.

* * * * *